United States Patent [19]

Vojvodich

[11] 4,279,465
[45] Jul. 21, 1981

[54] DEVICE FOR TRANSMITTING AND RECEIVING OPTICAL DATA ON THE SAME OPTICAL TRANSMISSION LINE

[75] Inventor: Mario M. Vojvodich, Morris Plains, N.J.

[73] Assignee: The Singer Company, Little Falls, N.J.

[21] Appl. No.: 99,236

[22] Filed: Nov. 30, 1979

[51] Int. Cl.³ .............................................. G02B 5/14
[52] U.S. Cl. .................................. 350/96.20; 250/227; 250/552; 350/96.17; 350/96.33; 370/1
[58] Field of Search ............... 350/96.15, 96.16, 96.17, 350/96.20, 96.24, 96.33; 250/227, 552; 370/1; 357/19, 30, 74

[56] References Cited

U.S. PATENT DOCUMENTS

| | | | |
|---|---|---|---|
| 3,639,770 | 2/1972 | Zizelmann | 250/574 |
| 3,780,295 | 12/1973 | Kapron et al. | 370/1 |
| 3,828,185 | 8/1974 | Vandling | 455/605 |
| 3,859,536 | 1/1975 | Thiel | 250/552 |
| 3,899,430 | 8/1975 | Ancker-Johnson | 370/4 |
| 3,952,265 | 4/1976 | Hunsperger | 350/96.15 |
| 3,996,476 | 12/1976 | Lazzara | 250/552 X |
| 3,996,526 | 12/1976 | d'Auria et al. | 350/96.15 X |
| 4,000,416 | 12/1976 | Goell | 350/96.33 X |
| 4,025,194 | 5/1977 | Teppo | 356/5 |
| 4,051,365 | 9/1977 | Fukuyama et al. | 250/552 X |
| 4,063,083 | 12/1977 | Cathey et al. | 455/607 |
| 4,072,399 | 2/1978 | Love | 350/96.16 |
| 4,101,197 | 7/1978 | Kent et al. | 350/96.17 |
| 4,118,100 | 10/1978 | Goell et al. | 350/96.20 |
| 4,125,777 | 11/1978 | O'Brien et al. | 357/19 X |
| 4,143,385 | 3/1979 | Miyoshi et al. | 357/19 |

*Primary Examiner*—John K. Corbin
*Assistant Examiner*—John D. Lee
*Attorney, Agent, or Firm*—L. A. Wright; T. W. Kennedy

[57] ABSTRACT

An optical device for the simultaneous transmission and reception of optical data on the same optical waveguide. A transmission and receiving means at each end of the fiber optic cable permits simultaneous transmission. Each transmit/receive means comprises a pedestal supporting an emitter and photodetector. The emitter is mounted centrally of the inner surface of the pedestal at the focal point of a circular ellipsoidal reflector. The photodetector is also mounted centrally of the inner surface of the pedestal and placed forward of the emitter. In this manner the emitters and photodetectors at each end of the fiber optic cable can transmit and receive simultaneously or in sequence on the same optical waveguide.

4 Claims, 8 Drawing Figures

DEVICE FOR TRANSMITTING AND RECEIVING OPTICAL DATA ON THE SAME OPTICAL TRANSMISSION LINE

This invention is related to optical transmission devices. More particularly, this invention is related to an optical transmission device in which optical data is transmitted and received simultaneously on the same optical transmission medium.

BACKGROUND OF THE INVENTION

The theory of optical waveguides has been known for some time. Optical waveguides may be defined as a bundle of optical fibers each having a transparent core surrounded by a layer of transparent cladding material which has a refractive index that is lower than that of the core. Communication transmitted by light waves over optical waveguides is much more efficient than communication transmitted by conventional transmission means. Moreover, by means of fiber optic cables, vastly more communication channels are available than can be had on conventional transmission cables of the same dimensions. In prior art optical waveguides it was necessary to employ separate optical transmission lines, one dedicated for transmission and the other dedicated for reception. The present invention provides means for simultaneously transmitting and receiving on the same optical waveguide.

BRIEF DESCRIPTION OF THE INVENTION

The present invention provides an optical waveguide in which transmission and reception optical signals can be carried simultaneously. At each end of the fiber optic cable of the invention there is a pedestal supporting an emitter and photodetector. The emitter is mounted centrally of the inner surface of the pedestal at the focal point of a circular ellipsoidal reflector. The photodector is also mounted centrally of the inner surface of the pedestal and placed forward of the emitter. In this manner the light emitted from the emitter is donut-shaped and the light impinging on the photodetector is isolated from the light of the adjacent emitter. Therefore, the emitters and photodectors at each end of the fiber optic cable can transmit and receive simultaneously or in sequence on the same transmission lines.

A second embodiment of the invention provides annular slits on the photodetectors to compensate different fiber optic cable dimensions. A third embodiment of the invention provides for fiber optic cables having concentrated layers of different refractive indices.

Accordingly, it is an object of this invention to provide an optical transmission system wherein transmission and reception is achieved simultaneously within the same medium.

In order to gain a better understanding of the invention, as well as other objects and further features thereof, reference is made to the following detailed description of the invention to be read in conjunction with the accompanying drawings wherein.

Figure 1:
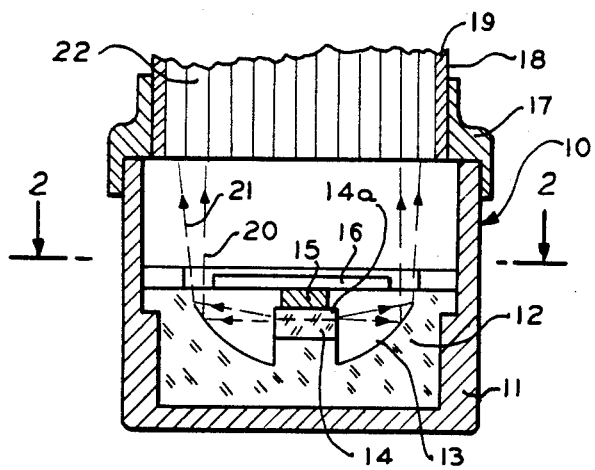
FIG. 1 is an elevational view showing one end connector of the fiber optic transmission device of the invention.
Figure 2:
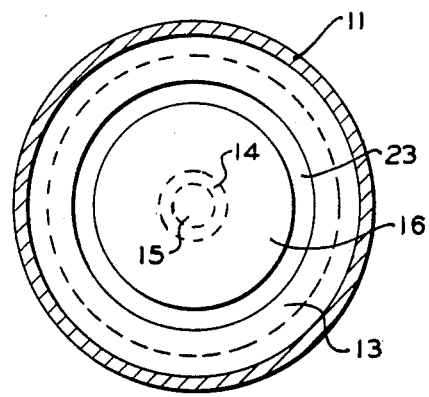
FIG. 2 is a top view taken along the line 2—2 of FIG. 1.

Referring to FIGS. 1 and 2, the construction of the transmitting and receiving optical device 10 of the invention is shown. The other end of the optical waveguide having an identical optical device is not shown. However, it would be exactly as optical device 10 shown in FIGS. 1 and 2. A casing 11 houses pedestal 12 which has a circular ellipsoidal reflector surface 13. The emitter 14, which may be a laser or laser diode, has a circular edge emitting surface 14a and is mounted in a conventional manner on pedestal 12. The circular edge emitting surface is positioned at the focal point of the ellipsoidal reflector surface of the pedestal. The light pattern 23 from reflector surface 13 is donut-shaped as seen in the top view of FIG. 2. The ray tracings 20 and 21 are shown schematically in the side view of FIG. 1. The area within the light donut is occupied by a photodetector 16 which is separated from the emitter by a spacer 15. Photodector 16 is positioned to sense optical data transmitted from the other end of optical cable or waveguide 18. Cable 18 contains fiber optic bundles 22 which run the length of the waveguide. The modulated light from emitter 14 will transmit optical data through cable 18 to the photodetector at the other end of the cable. Cable 18 is connected to optical device 10 by connector 17. A reflective layer 19 of cable 18 encircles fiber optic bundles 22 upon which rays 20 and 21 impinge. With an optical device 10 connected to both ends of the fiber optic cable, transmission and reception can be performed simultaneously or in sequence.

Figure 3:
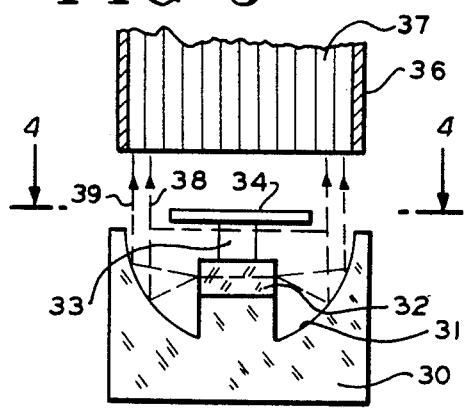
FIG. 3 is a view similar to FIG. 1 in which the cable connection to the pedestal is omitted.
Figure 4:
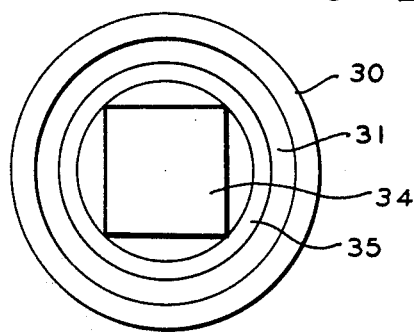
FIG. 4 is a top view taken along the line 4—4 of FIG. 3.

FIGS. 3 and 4 show another embodiment of the optical device in which photodetector 34 is in the shape of a square and pedestal 30 is unconnected to fiber optic cable 36. Elements 31, 32, 33, 37, 38 and 39 function in the same manner as their counterparts shown in FIGS. 1 and 2. In addition, the emitter output light 35 is also donut-shaped as seen in FIG. 4.

Figure 5:
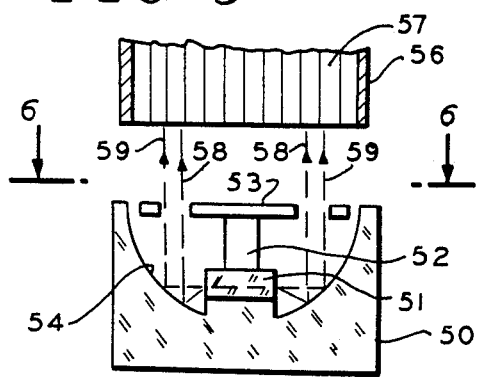
FIG. 5 is a second embodiment of the invention showing a split annular photodetector.
Figure 6:
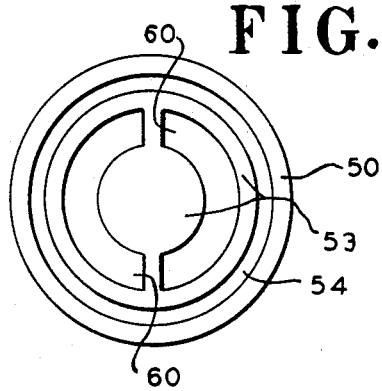
FIG. 6 is a top view taken along the line 6—6 of FIG. 5.

FIGS. 5 and 6 show a variation of the photodetector design of FIGS. 3 and 4 that allows for optical cables of different diameters. In FIG. 6 annular slits 60 are etched out of photodetector 53 wafer to permit the donut of emitted light 55 to exit from reflector cavity 54 into the adjacent fiber bundles 57. Here again, elements 50, 51, 56, 58 and 59 function in the same manner as their corresponding parts in FIGS. 1 and 2.

Figure 7:
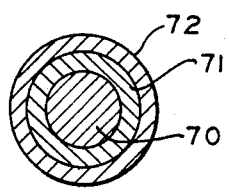
FIG. 7 is a third embodiment of the invention showing a sectional view of the fiber optic cable having three concentric layers of differing refractive indices.
Figure 8:
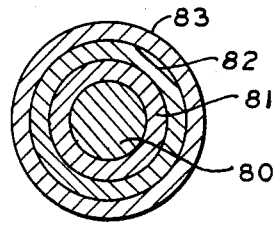
FIG. 8 is a sectional view of a fiber optic cable having four concentric layers wherein the first and third layers have a high refractive index and the second and fourth layers have a low refractive index.

The optical devices shown in FIGS. 1-6 have been directed toward multifiber and multimode operation. However, the claimed invention may be operated with a single fiber, multi- or single mode operation if the fiber configuration is modified as shown in FIGS. 7 and 8. In FIG. 7, the construction of the fiber consists of three materials 70, 71 and 72 usually glass or plastic with different indices of refraction. For example, layer 70 may have the highest index of refraction, layer 71 a lower index of refraction and layer 72 may have an index of refraction lower than layer 71.

FIG. 8 shows another approach in which the construction of the fiber has four concentric layers 80, 81, 82 and 83 with two or four different indices of refraction. For example, all of the layers may have different indices of refraction in ascending order. Alternatively, layers 80 and 82 may have the same index of refraction and layers 81 and 83 may have an index of refraction above or below that of layers 80 and 82.

The invention as shown in the drawings operates to provide two-way communication between the light emitter and the photodetector on the same optical link. The edge emitting laser or light emitting diode (LED) is mounted on the pedestal within the reflector cavity which directs a ring of light from the emitter into the optical fiber or fibers. The photodetector is mounted within the light ring in the area which is not illuminated and does not interfere significantly with the emitted light rays. The photodetector, therefore, can accept or receive light signals from the fiber or fibers and the modulated emitter light output can be internally reflected by the fiber or fibers thereby transmitting and receiving light signals in the same fiber or fibers.

Operation can be with multiple or single optical fibers. The medium can be a composite glass or plastic base or a plastic and glass combination. The transmission in the fibers may be multimode or single mode which is governed by the choice of fiber size, fiber material and fiber cladding configuration.

While the present invention has been described in preferred embodiments, it will be obvious to those skilled in the art that various modifications can be made therein within the scope of the invention. It is intended that the appended claims cover all such modifications.

What is claimed is:

1. A waveguide for the simultaneous transmission and reception of optical data along the waveguide comprising:

an elongate fiber optic cable assembly having opposite end portions with respective axes of symmetry, said cable assembly including a first elongate radially inner cable portion with an end face and including a second elongate radially outer annular cable portion with an annular end face, said outer cable portion being arranged to surround said inner cable portion, an emitter-photodetector assembly connected to each said cable assembly end portion coaxially therewith, and modulating means connected to each said emitter-photodetector assembly for simultaneously transmitting signals in opposite directions respectively through said inner and outer cable portions, wherein each said emitter-photodetector assembly comprises:

a pedestal connected to said cable assembly end portion coaxially therewith and having an inner ellipsoidal reflector surface with a focal point, an emitter connected to said pedestal coaxially therewith and mounted at the focal point of said pedestal surface for transmitting a circular band of light to one of said cable portion end faces, a photodetector connected to said emitter coaxially therewith and having a photodetector surface for receiving a pattern of light from the other of said cable portion end faces.

2. The waveguide of claim 1, wherein:

said photodetector has a wafer having annular slits for setting the inner and outer dimensions of said emitter circular band of light, according to the dimensions of said related cable portion end face so that the circular band of light from said emitter can be transmitted through fiber optic cables of different diameters and for forming an annular photodetector surface portion disposed radially outwardly from said emitter circular band of light.

3. The waveguide of claim 1, wherein:

said fiber optic cable inner portion includes an inner material of high index of refraction, and includes a second material of low index of refraction surrounding said inner material, and said cable outer portion includes a third material of an index of refraction lower than said second material surrounding said second material.

4. The waveguide of claim 1, wherein:

said fiber optic cable assembly includes four layers in which the cable inner portion includes the first and second layers and the cable outer portion includes the third and fourth layers, and in which the first and third layers are of a high index of refraction and the second and fourth layers are of a low index of refraction.

* * * * *